US009553183B2

United States Patent
Curatola (10) Patent No.: US 9,553,183 B2
(45) Date of Patent: Jan. 24, 2017

(54) GATE STACK FOR NORMALLY-OFF COMPOUND SEMICONDUCTOR TRANSISTOR

(71) Applicant: Infineon Technologies Austria AG, Villach (AT)

(72) Inventor: Gilberto Curatola, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/921,630

(22) Filed: Jun. 19, 2013

(65) Prior Publication Data

US 2014/0374765 A1   Dec. 25, 2014

(51) Int. Cl.
*H01L 29/778*   (2006.01)
*H01L 29/20*   (2006.01)
(Continued)

(52) U.S. Cl.
CPC ....... *H01L 29/7783* (2013.01); *H01L 29/2003* (2013.01); *H01L 29/205* (2013.01); *H01L 29/66431* (2013.01)

(58) Field of Classification Search
CPC ............ H01L 29/66462; H01L 29/778; H01L 29/66431; H01L 29/7783; H01L 29/205; H01L 29/2003
(Continued)

(56) References Cited

U.S. PATENT DOCUMENTS 4,974,038 A * 11/1990 Delagebeaudeuf . H01L 27/0605
257/14
7,705,415 B1 * 4/2010 Nabet .................. H01L 31/1035
257/443
(Continued)

FOREIGN PATENT DOCUMENTS

GB   2482308 A * 2/2012 ........... H01L 29/778
JP   WO 2011162243 A1 * 12/2011 ....... H01L 29/42316

OTHER PUBLICATIONS

Nakajima, Akira, "GaN-Based Super Heterojunction Field Effect Transistors Using the Polarization Junction Concept", IEEE Electron Device Letters, vol. 32, No. 4, Apr. 2011, pp. 542-544.

*Primary Examiner* — Matthew Reames
*Assistant Examiner* — Vincent Wall
(74) *Attorney, Agent, or Firm* — Murphy, Bilak & Homiller, PLLC (57) ABSTRACT

A normally-off compound semiconductor transistor includes a heterostructure body and a gate stack on the heterostructure body. The heterostructure body includes a source, a drain spaced apart from the source, and a channel for connecting the source and the drain. The channel includes a first two-dimensional charge carrier gas of a first polarity arising in the heterostructure body due to piezoelectric effects. The gate stack controls the channel in a region of the heterostructure body under the gate stack. The gate stack includes at least one III-nitride material which gives rise to a second two-dimensional charge carrier gas of a second (Continued)

polarity opposite the first polarity in the gate stack or in the heterostructure body under the gate stack due to piezoelectric effects. The second two-dimensional charge carrier gas counter-balances polarization charges in the first two-dimensional charge carrier gas so that the channel is disrupted under the gate stack.

8 Claims, 9 Drawing Sheets

(51) Int. Cl.
    *H01L 29/205*     (2006.01)
    *H01L 29/66*     (2006.01)

(58) Field of Classification Search
    USPC . 257/76, 77, 194, E21.09, E2.089; 438/172, 438/478
    See application file for complete search history.

(56) References Cited

U.S. PATENT DOCUMENTS

| | | | |
|---|---|---|---|
| 7,985,986 B2* | 7/2011 | Heikman et al. | 257/194 |
| 2005/0026394 A1* | 2/2005 | Letertre | C30B 25/02 |
| | | | 438/459 |
| 2010/0327322 A1 | 12/2010 | Kub et al. | |
| 2012/0280278 A1 | 11/2012 | Curatola et al. | |
| 2013/0043485 A1* | 2/2013 | Ueno | H01L 29/42316 |
| | | | 257/76 |
| 2013/0099285 A1* | 4/2013 | Hwang et al. | 257/194 |
| 2013/0126942 A1* | 5/2013 | Nakajima | H01L 29/42316 |
| | | | 257/192 |

\* cited by examiner

GATE STACK FOR NORMALLY-OFF COMPOUND SEMICONDUCTOR TRANSISTOR

TECHNICAL FIELD

The instant application relates to compound semiconductor transistors, and more particularly to normally-off III-nitride based transistors.

BACKGROUND

Conventional HEMTs (high electron mobility transistors) are typically fabricated in GaN technology and generally characterized by a negative threshold voltage. That is, a current flows between source and drain terminals of the device even without applying any voltage to the gate electrode to open the transistor. Indeed, in GaN technology, a thin channel (inversion layer) is automatically created via strain and polarization effects between the source and drain terminals without the application of any voltage to the gate electrode. As such, the device is commonly referred to as being normally-on.

The normally-on feature of HEMTs is an intrinsic property of GaN technology, and restricts the range of applications for GaN technology to those applications where a power supply is available to generate the negative voltages necessary to turn off the GaN device. Moreover, the normally-on feature complicates the design of the circuitry needed to drive GaN transistors.

Attempts have been made to fabricate normally-off GaN HEMTs, i.e. GaN transistors with a positive threshold voltage. For example, a relatively thick (typically 100 nm or greater) p-type doped GaN material can be formed under the gate electrode. This thick p-type GaN layer depletes the inversion layer under the gate electrode, shifting the threshold voltage to positive values. The p-type GaN layer must be thick enough to create a vertical field which depletes and populates the naturally occurring inversion channel underlying the barrier layer, typically a layer of AlGaN. In addition, the vertical field generated by a voltage applied to the gate electrode allows for on and off modulation of the inversion layer.

However, unlike conventional silicon technology, doping of a large bandgap material such as GaN is not trivial. Indeed, the fabrication of a thin p-type doped GaN layer requires very complicated processing. Moreover, threshold voltage instability can arise due to the non-uniform doping of the GaN layer and, in particular due to surface accumulation of p-type dopant elements at the exposed GaN surface. In addition, the maximum gate voltage which can be tolerated by the device is limited by the presence of a p-n junction under the gate electrode. Once the built-in voltage of the p-n junction is reached, a large and possibly detrimental gate leakage flows directly from the gate contact toward the source and drain electrodes. Using a thick p-type doped GaN layer under the gate electrode also limits the transconductance of the device because the gate electrode is spaced further away from the inversion channel by a distance corresponding to the thickness of the p-type GaN layer. The p-type doped GaN layer yields a threshold voltage of about 1V.

SUMMARY

According to an embodiment of a normally-off compound semiconductor transistor, the normally-off transistor comprises a heterostructure body and a gate stack on the heterostructure body. The heterostructure body includes a source, a drain spaced apart from the source, and a channel for connecting the source and the drain. The channel comprises a first two-dimensional charge carrier gas of a first polarity arising in the heterostructure body due to piezoelectric effects. The gate stack controls the channel in a region of the heterostructure body under the gate stack. The gate stack comprises at least one III-nitride material which gives rise to a second two-dimensional charge carrier gas of a second polarity opposite the first polarity in the gate stack or in the heterostructure body under the gate stack due to piezoelectric effects. The second two-dimensional charge carrier gas counter-balances polarization charges in the first two-dimensional charge carrier gas so that the channel is disrupted under the gate stack, rendering the transistor normally-off.

According to an embodiment of a method of manufacturing a normally-off compound semiconductor transistor, the method comprises: forming a heterostructure body including a source, a drain spaced apart from the source and a channel for connecting the source and the drain, the channel comprising a first two-dimensional charge carrier gas of a first polarity arising in the heterostructure body due to piezoelectric effects; and forming a gate stack on the heterostructure body for controlling the channel in a region of the heterostructure body under the gate stack, the gate stack comprising at least one III-nitride material which gives rise to a second two-dimensional charge carrier gas of a second polarity opposite the first polarity in the gate stack or in the heterostructure body under the gate stack due to piezoelectric effects, the second two-dimensional charge carrier gas counter-balancing polarization charges in the first two-dimensional charge carrier gas so that the channel is disrupted under the gate stack.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

According to embodiments described herein, a compound semiconductor transistor is provided with a conductive channel inversion region that automatically arises in a heterostructure body due to piezoelectric effects. The compound semiconductor transistor is made normally-off by generating a second inversion region of the opposite polarity as the channel region, also by piezoelectric effects. The second inversion region counter-balances polarization charges in the channel inversion region so that the channel region is disrupted under the gate stack of the transistor. For example, in the case of an nMOS-type GaN HEMT with an electron gas inversion region as the channel, a hole gas inversion region is formed by piezoelectric effects in the gate stack or in the heterostructure body under the gate stack to deplete the channel in a region of the heterostructure body underneath the gate stack and realize a normally-off device. This concept can be applied to both nMOS and pMOS-type GaN devices, by inverting the polarity of both inversion layers. Such a compound semiconductor transistor has a tunable threshold voltage (by varying the thickness and/or molecular content of the gate stack), high current drive capability and high transconductance (owing to a thinner gate stack as compared to conventional normally-off GaN HEMTs having a thick p-type gate structure).

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form an electron gas inversion region as the channel. The compound semiconductor device may have AlInN/AlN/GaN barrier/spacer/buffer layer structures. In general, the normally-off compound semiconductor transistor can be realized using any suitable III-nitride technology such as GaN that permits the formation of opposite polarity inversion regions due to piezoelectric effects.

Specifically with regard to GaN technology, the presence of polarization charges and strain effects in a GaN-based heterostructure body due to piezoelectric effects yield a two-dimensional charge carrier gas in the heterostructure body characterized by very high carrier density and carrier mobility. Such a two-dimensional charge carrier gas, such as a 2DEG (two-dimensional electron gas) or 2DHG (two-dimensional hole gas), forms the conductive channel of the HEMT near the interface between, e.g., a GaN alloy barrier region and a GaN buffer region. A thin, e.g. 1-2 nm, AlN layer can be provided between the GaN buffer region and the GaN alloy barrier region to minimize alloy scattering and enhance 2DEG mobility. In a broad sense, the compound semiconductor transistors described herein can be formed from any binary, ternary or quaternary III-nitride compound semiconductor material where piezoelectric effects are responsible for the device concept.

Figure 1:
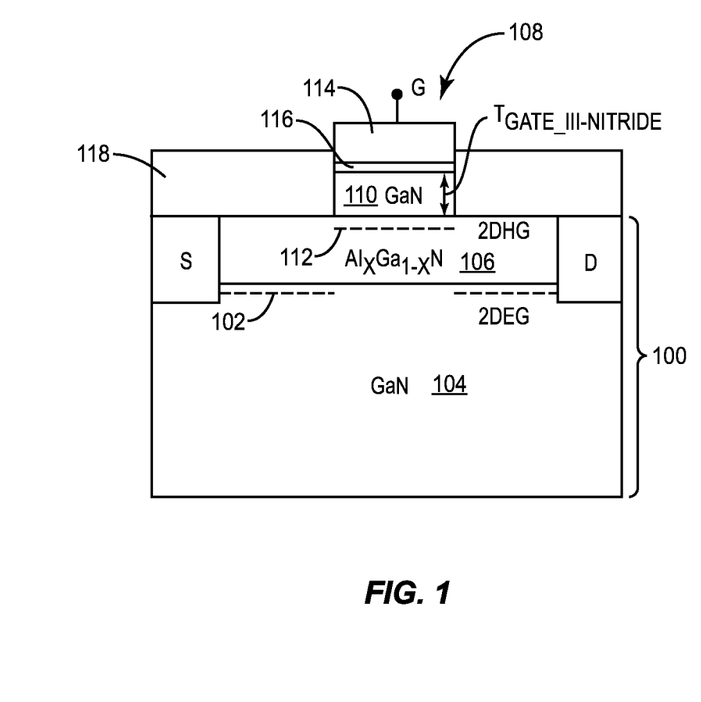
FIG. 1 illustrates a partial cross-sectional view of an embodiment of a normally-off compound semiconductor transistor.

FIG. 1 illustrates a partial cross-sectional view of an embodiment of a normally-off compound semiconductor transistor, implemented as an n-MOS type HEMT. The n-MOS type HEMT includes a hetero structure body 100 having a source (S), a drain (D) spaced apart from the source, and a channel 102 for connecting the source and the drain. According to this embodiment, the heterostructure body 100 comprises AlGaN 106 on GaN 104. The term 'AlGaN' as used herein refers to the general chemical composition $Al_xGa_{1-x}N$. A two-dimensional electron gas (2DEG) arises near the interface between the AlGaN 106 and the GaN 104 of the heterostructure body 100 due to piezoelectric effects, forming the conductive channel 102 of the n-MOS type HEMT. More specifically, the total polarization of the AlGaN 106 is stronger than that of the underlying relaxed GaN 104. The negative spontaneous polarization of both layers 104, 106 and the negative piezoelectric polarization under tensile strain points from the Nitrogen atom towards the nearest Gallium atom along the [0001] axis. This results in a positive two-dimensional polarization-induced sheet charge (2DEG for short).

The n-MOS type HEMT further includes a gate stack 108 on the heterostructure body 100. The gate stack 108 controls the channel 102 in a region of the heterostructure body 100 under the gate stack 108. According to the embodiment of FIG. 1, the gate stack 108 comprises GaN 110 deposited or regrown on the AlGaN 106 of the heterostructure body 100. The GaN 110 of the gate stack 108 is thick enough so that a two-dimensional hole gas (2DHG) 112 arises under the gate stack 108 in the heterostructure body 100 due to piezoelectric effects, near the interface between the GaN 110 of the gate stack 108 and the AlGaN 106 of the heterostructure body 100. In this case both layers 106, 110 have negative spontaneous polarization and positive piezoelectric polarization, yielding the 2DHG 112 in the heterostructure body 100 under the gate stack 108. The 2DHG 112 has the opposite polarity of the 2DEG channel 102 and therefore counter-balances polarization charges in the 2DEG channel 102, disrupting the channel 102 under the gate stack 108 (as indicated by the break in the 2DEG channel 102) and rendering the n-MOS type HEMT normally-off so that a positive gate voltage is needed to turn the HEMT on. In one embodiment, the thickness ($T_{GATE\_III-Nitride}$) of the GaN 110 of the gate stack 108 is less than 100 nm but thick enough to disrupt the channel 102 under the gate stack 108. The gate stack 108 further comprises a metal 114 on the GaN 110 of the gate stack 108. The metal 114 acts as a gate electrode (G). An optional oxide 116 such as SiO2 can be interposed between the metal 114 and the GaN 110 of the gate stack 108 if gate leakage is a concern. A passivation layer 118 such as SiN can be formed on the heterostructure body 100 and laterally surround the gate stack 108.

Figure 2:
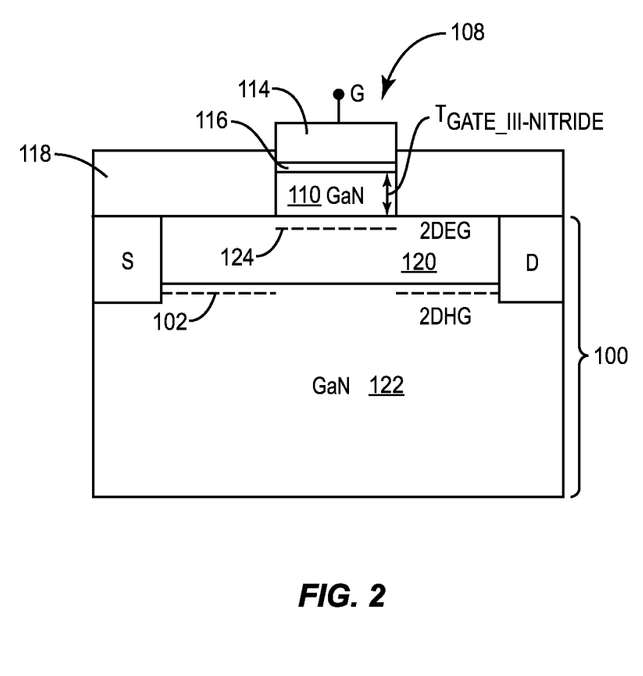
FIG. 2 illustrates a partial cross-sectional view of another embodiment of a normally-off compound semiconductor transistor.

FIG. 2 illustrates a partial cross-sectional view of another embodiment of a normally-off compound semiconductor transistor, implemented as a p-MOS type HEMT. The construction of the p-MOS type HEMT shown in FIG. 2 is similar to that of the n-MOS type HEMT shown in FIG. 1, however the heterostructure body 100 comprises InGaN 120 on GaN 122 according to the embodiment shown in FIG. 2. The term 'InGaN' as used herein refers to the general chemical composition $In_xGa_{1-x}N$. Positive polarization charges result from the piezoelectric effects caused by forming the InGaN 120 on the GaN 122, and thus the channel region 102 arising near the interface between the InGaN 120 and the GaN 122 of the heterostructure body 100 is a 2DHG instead of a 2DEG. Further according to this embodiment, the gate stack 108 comprises GaN 110 on the InGaN 120 of the heterostructure body 100. Such an arrangement of GaN 110 on InGaN 120 yields negative polarization charges and thus the formation of a 2DEG 124 near the interface between the GaN 110 of the gate stack 108 and the InGaN 120 of the heterostructure body 100. The 2DEG 124 counter-balance polarization charges in the 2DHG channel 102 so that the channel 102 is disrupted under the gate stack 108 (as indicated by the break in the 2DHG channel 102).

Other III-nitride material combinations can be used to yield a 2DEG or a 2DHG. For example, InGaN, InN or AlGaN/GaN can be used to form a 2DHG. Still other III-nitride combinations are possible to form a 2DHG, as are various III-nitride combinations for forming a 2DEG. In general, any standard combination of III-nitride materials suitable to realize a 2DHG and a 2DEG can be used in the compound semiconductor transistor structures described herein to disrupt the channel 102 under the gate stack 108.

The gate stack structures described herein do not use p-type doping in the GaN layer 110 underneath the gate electrode. Instead piezoelectric effects are utilized to form a complimentary inversion region that disrupts the channel 102 under the gate stack 108, to realize a normally-off compound semiconductor transistor. The high 2DHG (2DEG) concentration achievable due to piezoelectric effects allows for downward scaling of the thicknesses of the different layers used in the gate stack 108. Compared to conventional HEMT structures, such a gate stack thickness reduction improves the overall transconductance of the device and the overall current drive capability.

Figure 3:
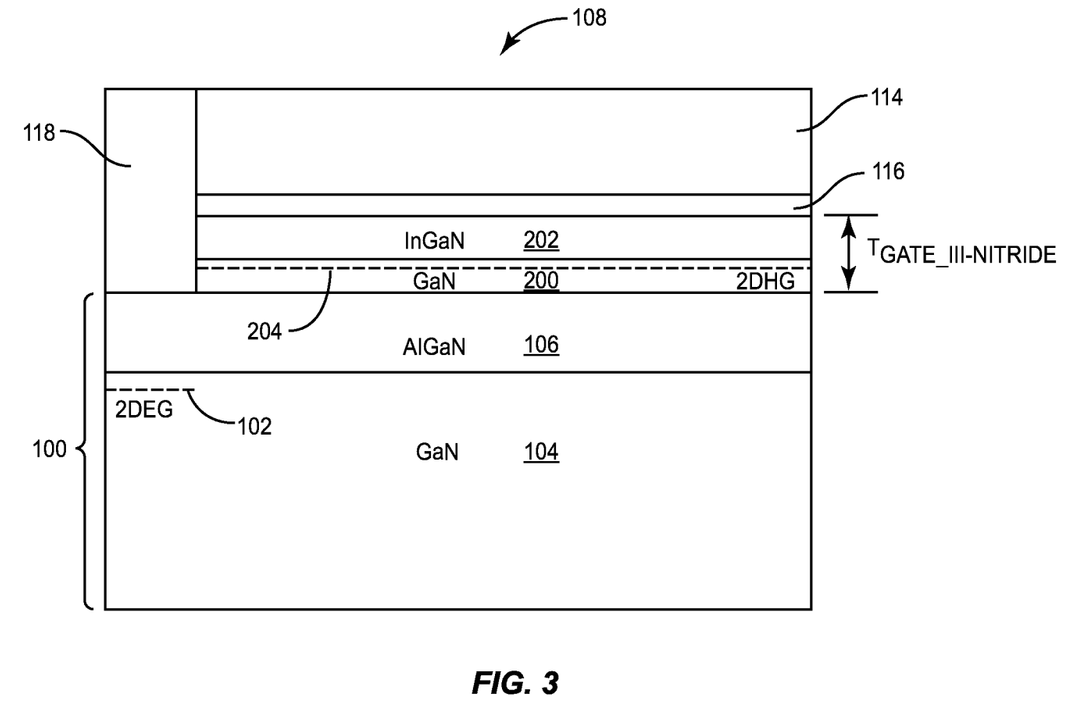
FIG. 3 illustrates a partial cross-sectional view of yet another embodiment of a normally-off compound semiconductor transistor.

FIG. 3 illustrates a partial cross-sectional view of yet another embodiment of a normally-off compound semiconductor transistor, implemented as an n-MOS type HEMT. The source and drain regions of the n-MOS type HEMT are out of view in FIG. 3. The construction of the n-MOS type HEMT shown in FIG. 3 is similar to that of the n-MOS type HEMT shown in FIG. 1, however the gate stack 108 comprises at least two III-nitride materials 200, 202 having different bandgaps which give rise to a two-dimensional charge carrier gas 204 in the gate stack 108 that counter-balances polarization charges in the underlying channel 102 so that the channel 102 is disrupted under the gate stack 108 (as indicated by the break in the channel 102).

According to this embodiment, the heterostructure body 108 comprises AlGaN 106 on GaN 104 so that the channel region 102 is a 2DEG arising in the heterostructure body 100 due to piezoelectric effects as previously described herein. The gate stack 108 comprises GaN 200 on the AlGaN 106 of the heterostructure body 100 and InGaN 202 on the GaN 200 of the gate stack 108. In one embodiment, the total thickness ($T_{GATE\_III\text{-}Nitride}$) of the InGaN 202 and the GaN 200 of the gate stack 108 is in a range of 10 nm to 30 nm. The resulting positive polarization charges that result from such a gate stack construction yield a 2DHG 204 in the gate stack 108 near the interface between the InGaN 202 and the GaN 200 of the gate stack 108. The thickness and/or In content of the InGaN 202 can be adjusted to vary the concentration of the 2DHG 204 in the gate stack 108 e.g. between $4.0\times10^{12}$ cm$^{-2}$ to $1.6\times10^{13}$ cm$^{-2}$. The 2DHG 204 in the gate stack 108 counter-balances polarization charges in the 2DEG channel 102 in the heterostructure body 100 so that the channel 102 is disrupted under the gate stack 108.

Figure 4:
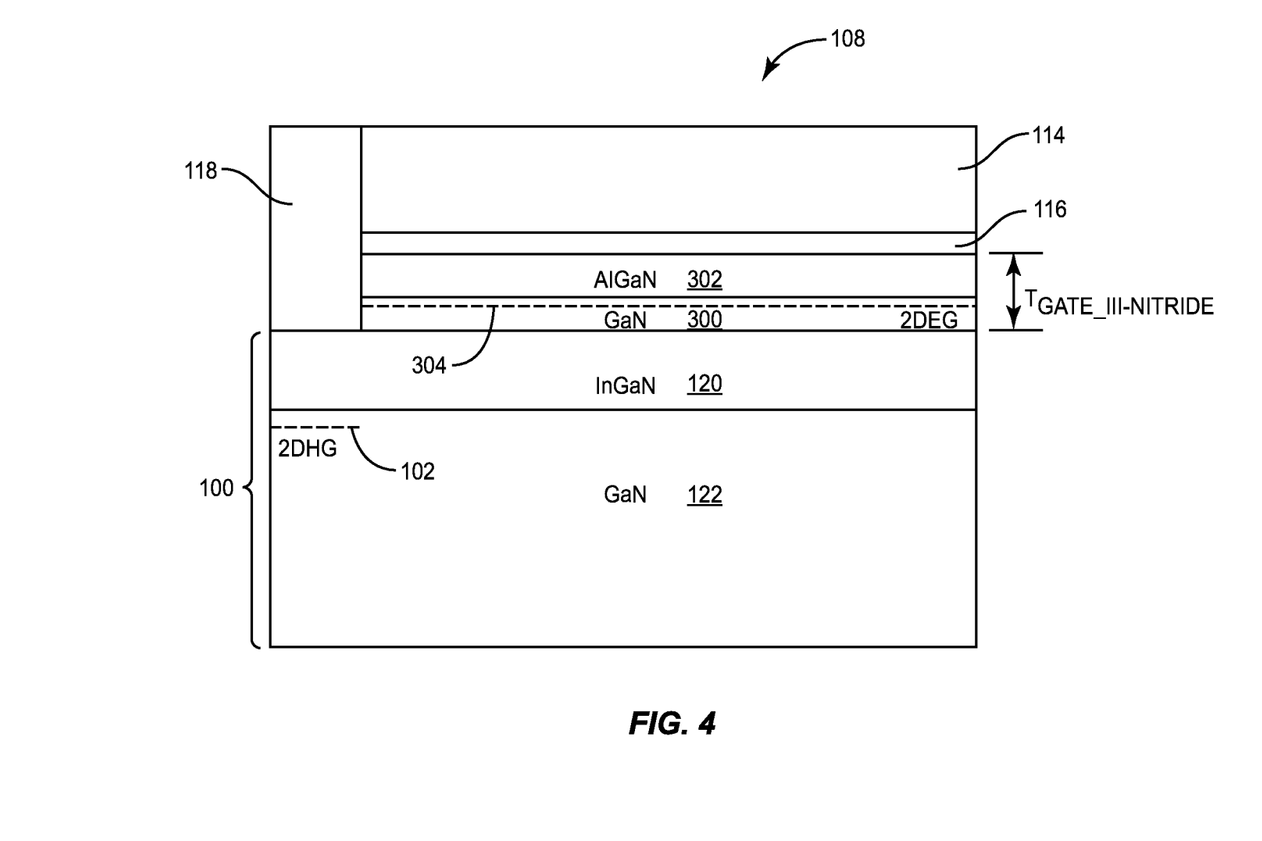
FIG. 4 illustrates a partial cross-sectional view of still another embodiment of a normally-off compound semiconductor transistor.

FIG. 4 illustrates a partial cross-sectional view of still another embodiment of a normally-off compound semiconductor transistor, implemented as a p-MOS type HEMT. The source and drain regions of the p-MOS type HEMT are out of view in FIG. 4. The construction of the p-MOS type HEMT shown in FIG. 4 is similar to that of the n-MOS type HEMT shown in FIG. 3, however the heterostructure body 100 comprises InGaN 120 on GaN 122 so that the channel region 102 is a 2DHG. Also, the gate stack 108 comprises GaN 300 on the InGaN 120 of the heterostructure body 100 and AlGaN 302 on the GaN 300 of the gate stack 108. The negative polarization charges that result from such a gate stack construction yield a 2DEG 304 in the gate stack 108 near the interface between the AlGaN 302 and the GaN 300 of the gate stack 108. The 2DEG 304 in the gate stack 108 counter-balances polarization charges in the 2DHG channel 102 in the heterostructure body 100 so that the channel 102 is disrupted under the gate stack 108 (as indicated by the break in the channel 102).

FIGS. 5A through 5E illustrate partial cross-sectional views of a semiconductor structure during different stages of a method of manufacturing a normally-off compound semiconductor transistor according to an embodiment.

Figure 5A:
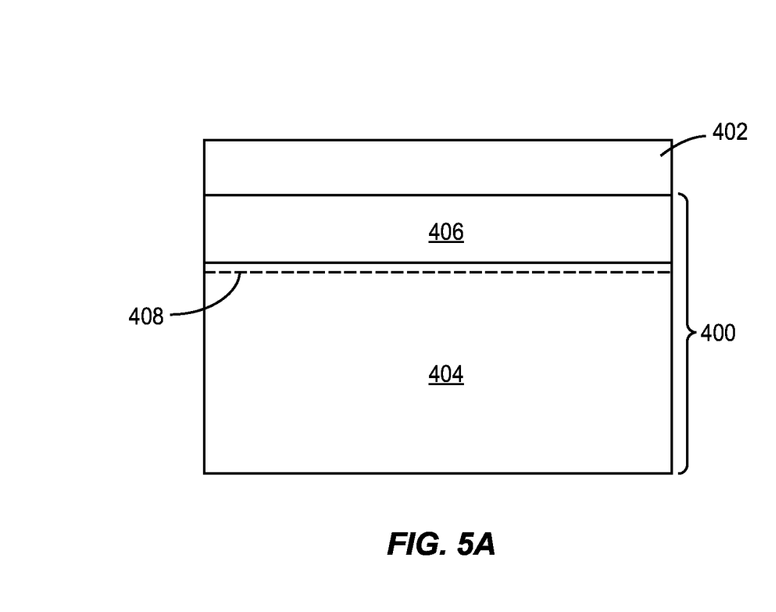
FIGS. 5A through 5E illustrate respective partial cross-sectional views of a semiconductor structure during different stages of a method of manufacturing a normally-off compound semiconductor transistor according to an embodiment.

FIG. 5A shows a heterostructure body 400 after a passivation layer 402 such as SiN, silicon oxide, aluminum oxide, etc. is formed on the heterostructure body 400. The heterostructure body 400 comprises III-nitride materials 404, 406 having different bandgaps which give rise to a two-dimensional charge carrier gas 408 in the heterostructure body 400. The two-dimensional charge carrier gas 408 can be a 2DEG or 2DHG as previously described herein, depending on the type of III-nitride materials 404, 406 used. The two-dimensional charge carrier gas 408 will connect a source and a drain of the transistor and form the channel of the transistor as previously described herein.

Figure 5B:
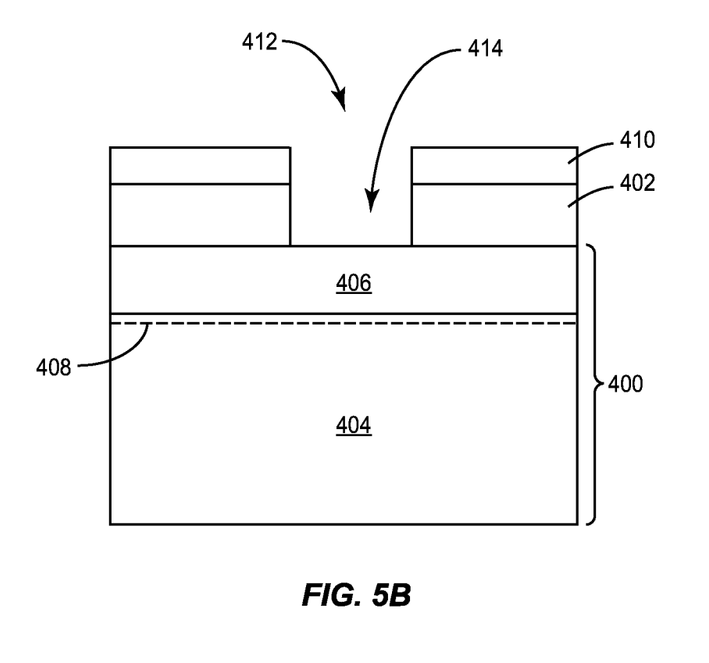

A mask 410 is then formed on the passivation layer 402 and photo-lithographically processed to form an opening 412 in the mask 410. The passivation layer 402 is processed through the opening 412 in the mask 410 to form a corresponding opening 414 in the passivation layer 402. The opening 414 in the passivation layer 402 exposes part of the heterostructure body 400. The resulting structure is shown in FIG. 5B.

Figure 5C:
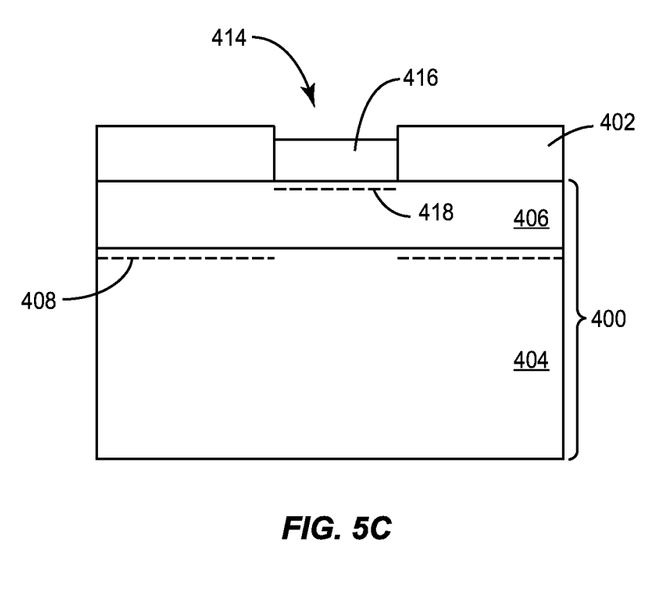

FIG. 5C shows the structure after the mask 410 is removed and at least one III-nitride material 416 is formed (e.g. by a re-growth process) on the exposed part of the heterostructure body 400 through the opening 414 in the passivation layer 402 via a re-growth process. The at least one III-nitride material 416 forms part of the gate stack of the transistor, and gives rise to a two-dimensional charge carrier gas 418 under the gate stack in the heterostructure body 400 as shown in FIG. 5C or in the gate stack itself. The location of the second two-dimensional charge carrier gas 418 depends on the number and type of III-nitride materials 416 used to construct the gate stack, as previously described herein. In either case, the second two-dimensional charge carrier gas 418 has the opposite polarity as the first two-dimensional charge carrier gas 408, and thus counter-balances polarization charges in the first two-dimensional charge carrier gas 408 so that the eventual channel of the transistor is disrupted under the gate stack.

Figure 5D:
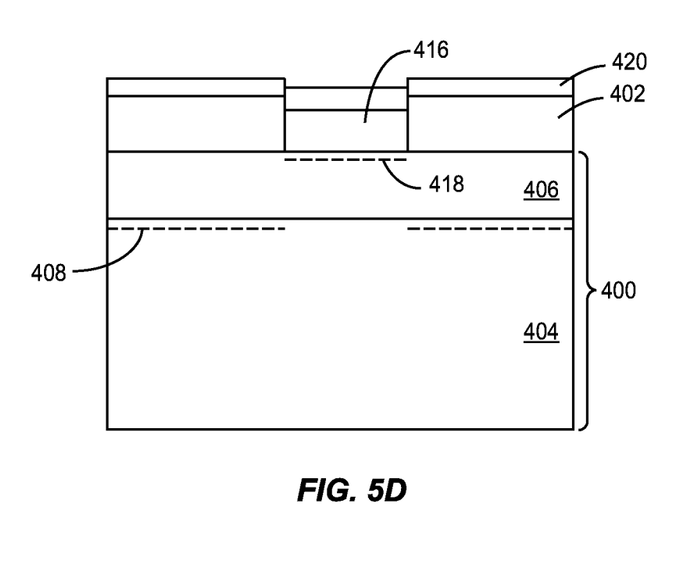

FIG. 5D shows the structure after an optional oxide layer 420 such as SiO2 is deposited on the structure, including on the gate stack.

Figure 5E:
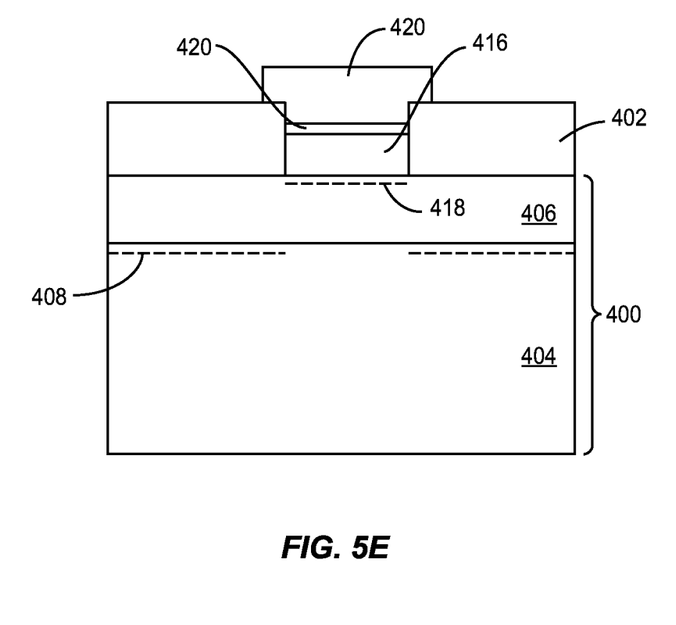

FIG. 5E shows the structure after an oxide etching process and after deposition of a gate metal 420 on the III-nitride material(s) 416 of the gate stack. In one embodiment, the heterostructure body 400 comprises AlGaN on GaN so that the first two-dimensional charge carrier gas 408 is a 2DEG arising near an interface between the AlGaN and the GaN of the heterostructure body 400, and III-nitride material(s) 416 of the gate stack comprise GaN on the AlGaN of the heterostructure body 400 and InGaN on the GaN of the gate stack so that the second two-dimensional charge carrier gas 418 is a 2DHG arising near an interface between the InGaN and the GaN of the gate stack as shown in FIG. 1. In another embodiment, the heterostructure body 400 comprises InGaN on GaN so that the first two-dimensional charge carrier gas 408 is a 2DHG arising near an interface between the InGaN and the GaN of the heterostructure body 400, and III-nitride material(s) 416 of the gate stack comprise GaN on the InGaN of the heterostructure body 400 and AlGaN on the GaN of the gate stack so that the second two-dimensional charge carrier gas 418 is a 2DEG arising near an interface between the AlGaN and the GaN of the gate stack as shown in FIG. 2. In yet another embodiment, the heterostructure body 400 comprises AlGaN on GaN so that the first two-dimensional charge carrier gas 408 is a 2DEG arising near an interface between the AlGaN and the GaN of the heterostructure body 400, and III-nitride material(s) 416 of the gate stack comprise GaN on the AlGaN of the heterostructure body 400 so that the second two-dimensional charge carrier gas 418 is a 2DHG arising near an interface between the GaN of the gate stack and the AlGaN of the heterostructure body 400 as shown in FIG. 3. In still another embodiment, the heterostructure body 400 comprises InGaN on GaN so that the first two-dimensional charge carrier gas 408 is a 2DHG arising near an interface between the InGaN and the GaN of the heterostructure body 400, and III-nitride material(s) 416 of the gate stack comprise GaN on the InGaN of the heterostructure body 400 so that the second two-dimensional charge carrier gas 418 is a 2DEG arising near an interface between the GaN of the gate stack and the InGaN of the heterostructure body 400 as shown in FIG. 4.

FIGS. 6A through 6E illustrate partial cross-sectional views of a semiconductor structure during different stages of a method of manufacturing a normally-off compound semiconductor transistor according to another embodiment.

Figure 6A:
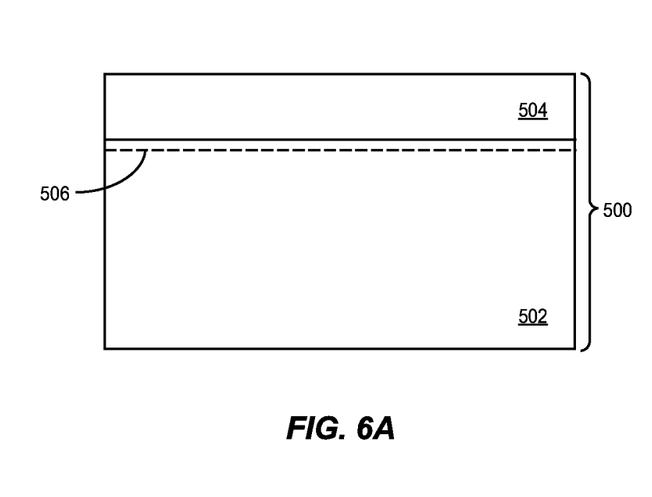
FIGS. 6A through 6E illustrate respective partial cross-sectional views of a semiconductor structure during different stages of a method of manufacturing a normally-off compound semiconductor transistor according to another embodiment.

FIG. 6A shows a heterostructure body 500 with III-nitride materials 502, 504 having different bandgaps which give rise to a two-dimensional charge carrier gas 506 in the heterostructure body 500. The two-dimensional charge carrier gas 506 can be a 2DEG or 2DHG as previously described herein, depending on the type of III-nitride materials 502, 504 used. The two-dimensional charge carrier gas 506 will connect a source and a drain of the transistor and form the channel of the transistor as previously described herein.

Figure 6B:
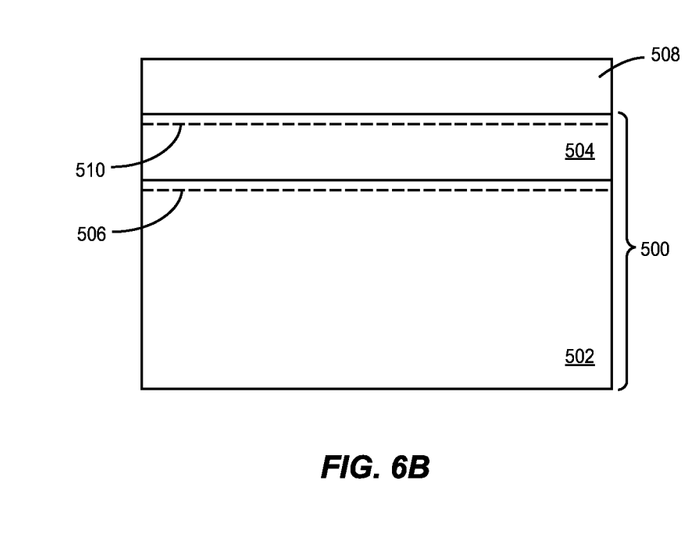

FIG. 6B shows the structure after at least one additional III-nitride layer 508 is deposited (e.g. grown in a metalorganic chemical vapor deposition tool) on the heterostructure body 500. The at least one additional III-nitride layer 508 is processed later to form the gate stack of the transistor. The at least one additional III-nitride layer 508 gives rise to a two-dimensional charge carrier gas 510 under the gate stack in the heterostructure body 500 as shown in FIG. 5B or in the gate stack itself, depending on the number and composition of additional III-nitride layer(s) 508 deposited on the heterostructure body 500. In either case, the second two-dimensional charge carrier gas 510 has the opposite polarity as the first two-dimensional charge carrier gas 506 and thus counter-balances polarization charges in the first two-dimensional charge carrier gas 506 so that the eventual channel of the transistor is disrupted under the gate stack.

Figure 6C:
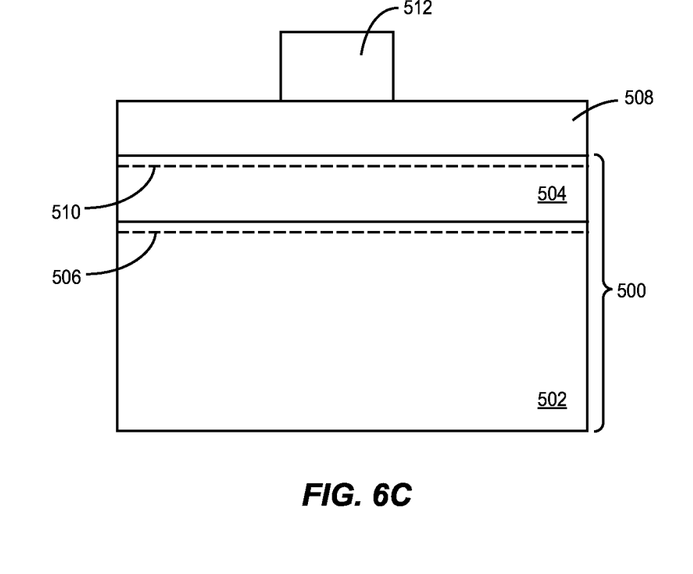

FIG. 6C shows the structure after a mask 512 is formed on the at least one additional III-nitride layer 508. The mask 512 protects part of the at least one additional III-nitride layer 508, and defines the location of the transistor gate stack.

Figure 6D:
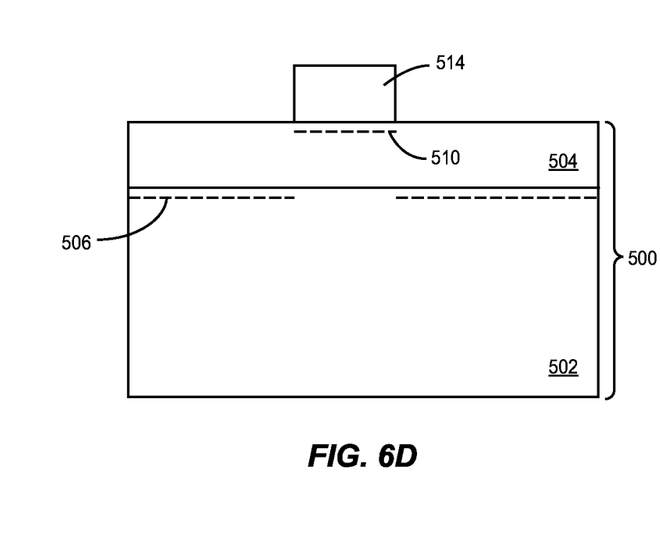

FIG. 6D shows the structure after the unprotected (unmasked) part of the at least one additional III-nitride layer 508 is removed from the heterostructure body 500. The remaining part of the at least one additional III-nitride layer 508 forms the gate stack 514 of the transistor.

Figure 6E:
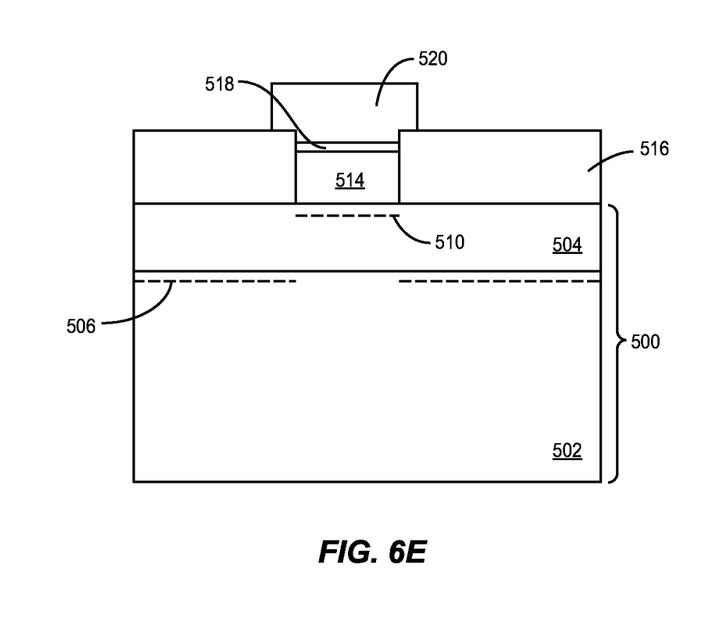

FIG. 6E shows a passivation layer 516 such as SiN can be formed on the heterostructure body 500 to laterally surround the gate stack 514. An optional oxide 518 such as SiO2 can be deposited on the gate stack 514, and metal 520 deposited on the III-nitride material(s) and on the oxide 518 of the gate stack 514 if the oxide 518 provided. Otherwise, the metal 520 is deposited directly on the III-nitride material(s) of the gate stack 514. In one embodiment, the heterostructure body 500 comprises AlGaN on GaN so that the first two-dimensional charge carrier gas 506 is a 2DEG arising near an interface between the AlGaN and the GaN of the heterostructure body 500, and the gate stack 514 comprises GaN on the AlGaN of the heterostructure body 500 and InGaN on the GaN of the gate stack 514 so that the second two-dimensional charge carrier gas 510 is a 2DHG arising near an interface between the InGaN and the GaN of the gate stack 514 as shown in FIG. 1. In another embodiment, the heterostructure body 500 comprises InGaN on GaN so that the first two-dimensional charge carrier gas 506 is a 2DHG arising near an interface between the InGaN and the GaN of the heterostructure body 500, and the gate stack 514 comprises GaN on the InGaN of the heterostructure body 500 and AlGaN on the GaN of the gate stack 514 so that the second two-dimensional charge carrier gas 510 is a 2DEG arising near an interface between the AlGaN and the GaN of the gate stack 514 as shown in FIG. 2. In yet another embodiment, the heterostructure body 500 comprises AlGaN on GaN so that the first two-dimensional charge carrier gas 506 is a 2DEG arising near an interface between the AlGaN and the GaN of the heterostructure body 500, and the gate stack 514 comprises GaN on the AlGaN of the heterostructure body 500 so that the second two-dimensional charge carrier gas 510 is a 2DHG arising near an interface between the GaN of the gate stack 514 and the AlGaN of the heterostructure body 500 as shown in FIG. 3. In still another embodiment, the heterostructure body 500 comprises InGaN on GaN so that the first two-dimensional charge carrier gas 506 is a 2DHG arising near an interface between the InGaN and the GaN of the heterostructure body 500, and the gate stack 514 comprises forming GaN on the InGaN of the heterostructure body 500 so that the second two-dimensional charge carrier gas 510 is a 2DEG arising near an interface between the GaN of the gate stack 514 and the InGaN of the heterostructure body 500 as shown in FIG. 4.

Standard processes can be employed to carry out the manufacturing steps illustrated in FIGS. 5A through 5E and FIGS. 6A through 6E, and therefore no further explanation is given in this regard.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A normally-off compound semiconductor transistor, comprising:
a heterostructure body including a source, a drain spaced apart from the source, and a channel for connecting the source and the drain, the channel comprising a first two-dimensional charge carrier gas of a first polarity arising in the heterostructure body due to piezoelectric effects; and
a gate stack on the heterostructure body for controlling the channel in a region of the heterostructure body under the gate stack, the gate stack comprising at least two III-nitride materials having different bandgaps which gives rise to a second two-dimensional charge carrier gas of a second polarity opposite the first polarity in the gate stack or in the heterostructure body under the gate stack due to piezoelectric effects, the second two-dimensional charge carrier gas counter-balancing polarization charges in the first two-dimensional charge carrier gas so that the channel is disrupted under the gate stack,
wherein the second two-dimensional charge carrier gas is spaced apart from and electrically disconnected from the source and the drain,
wherein the heterostructure body comprises a GaN buffer region and a GaN alloy barrier region on the GaN buffer region,
wherein the GaN buffer region, the GaN alloy barrier and the at least two III-nitride materials of the gate stack are planar.

2. The normally-off compound semiconductor transistor of claim 1, wherein a total thickness of the at least two III-nitride materials of the gate stack is in a range of 100 nm to 10 nm.

3. The normally-off compound semiconductor transistor of claim 2, wherein the total thickness of the at least two III-nitride materials of the gate stack is in a range of 10 nm to 30 nm.

4. The normally-off compound semiconductor transistor of claim 1, wherein the gate stack further comprises a metal on the at least two III-nitride materials.

5. The normally-off compound semiconductor transistor of claim 4, wherein the gate stack further comprises an oxide interposed between the metal and the at least two III-nitride materials.

6. The normally-off compound semiconductor transistor of claim 1, wherein the GaN alloy barrier region comprises AlGaN on the GaN buffer region, the first two-dimensional charge carrier gas is a two-dimensional electron gas arising near the interface between the AlGaN barrier region and the GaN buffer region, the gate stack comprises GaN on the AlGaN barrier region and InGaN on the GaN of the gate stack, and the second two-dimensional charge carrier gas is a two-dimensional hole gas arising near an interface between the InGaN and the GaN of the gate stack.

7. The normally-off compound semiconductor transistor of claim 1, wherein the GaN alloy barrier region comprises InGaN on the GaN buffer region, the first two-dimensional charge carrier gas is a two-dimensional hole gas arising near the interface between the InGaN barrier region and the GaN buffer region, the gate stack comprises GaN on the InGaN barrier region and AlGaN on the GaN of the gate stack, and the second two-dimensional charge carrier gas is a two-dimensional electron gas arising near an interface between the AlGaN and the GaN of the gate stack.

8. A normally-off compound semiconductor transistor, comprising:
a III-nitride heterostructure body including a channel for connecting a source and a drain of the normally-off compound semiconductor transistor, the channel comprising a first two-dimensional charge carrier gas of a first polarity arising in the III-nitride heterostructure body;
a gate stack on the III-nitride heterostructure body for controlling the channel in a region of the III-nitride heterostructure body under the gate stack, the gate stack being spaced apart laterally from the drain and the source, the gate stack comprising an oxide and a GaN material devoid of p-type doping, wherein the oxide is in direct contact with the GaN material; and
a second two-dimensional charge carrier gas of a second polarity opposite the first polarity in the gate stack or in the III-nitride heterostructure body under the gate stack, the second two-dimensional charge carrier gas counter-balancing polarization charges in the first two-dimensional charge carrier gas so that the channel is disrupted in a region under the gate stack,
wherein the region of channel interruption is aligned vertically with the second two-dimensional charge carrier gas so that the first two-dimensional charge carrier gas is interrupted in the region vertically aligned with the second two-dimensional charge carrier and is present elsewhere.

* * * * *